United States Patent
Kingsborough et al.

(10) Patent No.: US 7,102,156 B1
(45) Date of Patent: Sep. 5, 2006

(54) MEMORY ELEMENTS USING ORGANIC ACTIVE LAYER

(75) Inventors: Richard Kingsborough, Acton, MA (US); Igor Sokolik, East Boston, MA (US); David Gaun, Brookline, MA (US); Swaroop Kaza, Woburn, MA (US); Suzette Pangrle, Cupertino, CA (US); Alexander Nickel, Mountain View, CA (US); Stuart Spitzer, Lynnfield, MA (US)

(73) Assignee: Spansion LLC Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 11/021,681

(22) Filed: Dec. 23, 2004

(51) Int. Cl.
*H01L 35/24* (2006.01)
*H01L 51/00* (2006.01)

(52) U.S. Cl. .......................... 257/40; 438/99
(58) Field of Classification Search .................... 257/40
See application file for complete search history.

(56) References Cited

U.S. PATENT DOCUMENTS

| | | | |
|---|---|---|---|
| 6,309,763 B1 | 10/2001 | Woo et al. | 428/690 |
| 6,798,068 B1 * | 9/2004 | Oglesby | 257/759 |
| 6,815,286 B1 * | 11/2004 | Krieger et al. | 438/238 |
| 6,858,481 B1 * | 2/2005 | Krieger et al. | 438/190 |
| 6,905,906 B1 * | 6/2005 | Sirringhaus et al. | 438/99 |
| 6,955,939 B1 * | 10/2005 | Lyons et al. | 438/82 |
| 2003/0053350 A1 * | 3/2003 | Krieger et al. | 365/200 |
| 2003/0059975 A1 * | 3/2003 | Sirringhaus et al. | 438/99 |
| 2003/0173612 A1 * | 9/2003 | Krieger et al. | 257/304 |
| 2004/0176560 A1 * | 9/2004 | Heeney et al. | 528/4 |
| 2005/0056832 A1 * | 3/2005 | Yamazaki et al. | 257/40 |
| 2006/0038982 A1 * | 2/2006 | Spitzer et al. | 356/151 |

\* cited by examiner

*Primary Examiner*—Andy Huynh
*Assistant Examiner*—Earl Taylor

(57) ABSTRACT

A memory element includes a first electrode, a passive layer on and in contact with the first electrode, a polyfluorene active layer on and in contact with the active layer, and a second electrode on and in contact with the polyfluorene active layer. The chemical structure of the polyfluorene active layer may be altered to take different forms, each providing a different memory element operating characteristic.

15 Claims, 5 Drawing Sheets

US 7,102,156 B1

MEMORY ELEMENTS USING ORGANIC ACTIVE LAYER

BACKGROUND OF THE INVENTION

1. Technical Field

This invention relates generally to memory devices, and more particularly, to memory element fabrication and configuration.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory element 30, which includes advantageous characteristics for meeting these needs. The memory element 30 includes an electrode 32, a superionic layer 34 on the electrode 32, an active layer 36 on the superionic layer 34, and an electrode 38 on the active layer 36. Initially, assuming that the memory element 30 is unprogrammed, in order to program the memory element 30, a negative voltage is applied to the electrode 38, while the electrode 32 is held at ground, so that an electrical potential $V_{pg}$ (the "programming" electrical potential) is applied across the memory element 30 from a higher to a lower electrical potential in the forward direction of the memory element 30 (see FIG. 2, a plot of memory element current vs. electrical potential applied across the memory element 30). This potential is sufficient to cause copper ions to be attracted from the superionic layer 34 toward the electrode 38 and into the active layer 36 (A), causing the active layer 36 (and the overall memory element 30) to be in a (forward) low-resistance or conductive state. Upon removal of such potential (B), the copper ions drawn into the active layer 36 during the programming step remain therein, so that the active layer 36 (and memory element 30) remain in a conductive or low-resistance state.

FIG. 3 illustrates the read step of the memory element 30 in its programmed (conductive) state. An electrical potential $V_r$ (the "read" electrical potential) is applied across the memory element 30 from a higher to a lower electrical potential in the forward direction of the memory element 30. This electrical potential is sufficient to overcome the threshold voltage $V_t$ of the inherent diode characteristic of the memory element 30, but is less than the electrical potential $V_{pg}$ applied across the memory element 30 for programming (see above). In this situation, the memory element 30 will readily conduct current, which indicates that the memory element 30 is in its programmed state.

In order to erase the memory element (FIG. 4), a positive voltage is applied to the electrode 38, while the electrode 32 is held at ground, so that an electrical potential $V_{er}$ (the "erase" electrical potential) is applied across the memory element 30 from a higher to a lower electrical potential in the reverse direction of the memory element 30. This potential is sufficient to cause copper ions to be repelled from the active layer 36 toward the electrode 32 and into the superionic layer 34, causing the active layer 36 (and the overall memory element 30) to be in a high-resistance or substantially non-conductive state (see FIG. 5, illustrating application of electrical potential $V_{er}$ across the memory element 30). This state remains upon removal of such potential from the memory element 30.

FIG. 6 illustrates the read step of the memory element 30 in its erased (substantially non-conductive) state. The electrical potential $V_r$ is again applied across the memory element 30 from a higher to a lower electrical potential in the forward direction of the memory element 30, as described above. With the active layer 34 (and memory element 30) in a high-resistance or substantially non-conductive state, the memory element 30 will not conduct significant current, which indicates that the memory element 30 is in its erased state.

When using typical materials for the active layer, certain problems can arise. For example, a material may provide certain operating characteristics of a memory element. However, it may be desirable to provide different operating characteristics of a memory element, and the particular material may not be able to provide such different memory element operating characteristics. Furthermore, the material may not be alterable in a manner to provide such different operating characteristics. In addition, the fabricated memory element is subjected to very high temperatures during back-end processing. Again, depending on the active layer material, such high temperatures may undesirably alter the operating characteristics of the memory element, or may render the memory element inoperative.

Therefore, what is needed is a memory element which includes an active layer which may be altered to determine the operating characteristics of the memory element, and which is capable of withstanding the high temperatures to which it is subjected during processing without degradation of performance.

DISCLOSURE OF THE INVENTION

Broadly stated, the present invention comprises a memory element structure comprising a first electrode, a passive layer on and in contact with the first electrode, a polyfluorene active layer on and in contact with the active layer, and a second electrode on and in contact with the polyfluorene active layer.

The present invention further comprises a method of providing a memory element structure comprising providing a first electrode, providing a passive layer on and in contact with the first electrode, providing a polyfluorene active layer on and in contact with the passive layer, and providing a second electrode on and in contact with the polyfluorene active layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiment when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
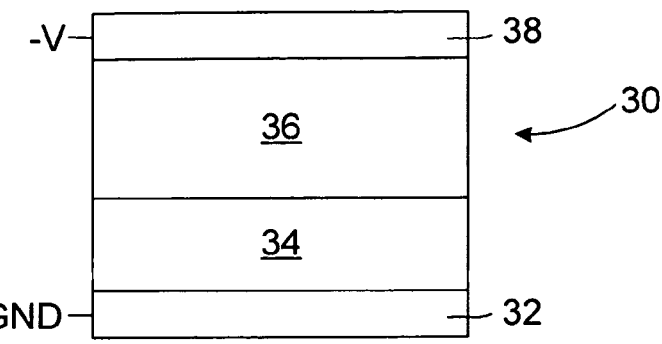
FIG. 1 is a cross-sectional view of a typical memory element, illustrating the programming thereof.
Figure 2:
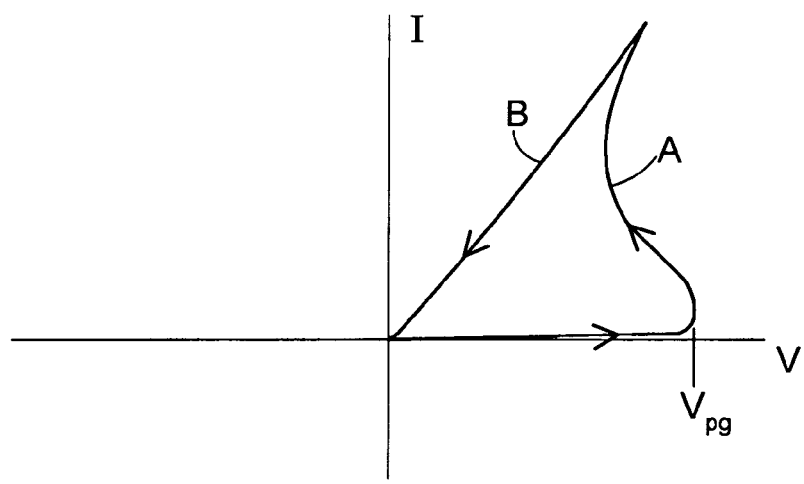
FIG. 2 is a plot of current vs. voltage in the programming of the memory element of FIG. 1.
Figure 3:
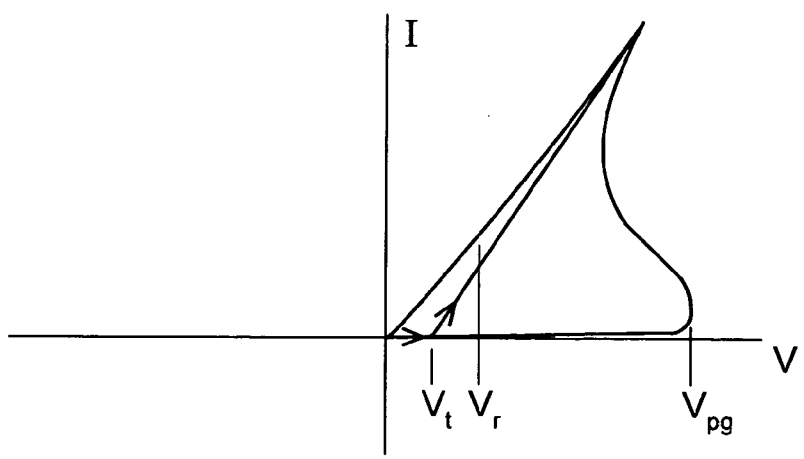
FIG. 3 is a plot of current vs. voltage in the reading of the programmed memory element of FIG. 1.
Figure 4:
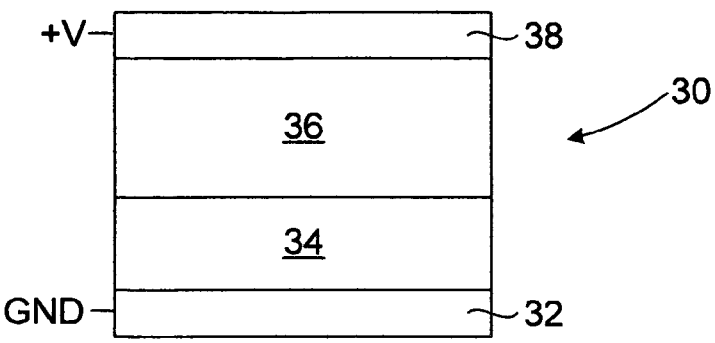
FIG. 4 is a view similar to that shown in FIG. 1, illustrating the erasing of the memory element.
Figure 5:
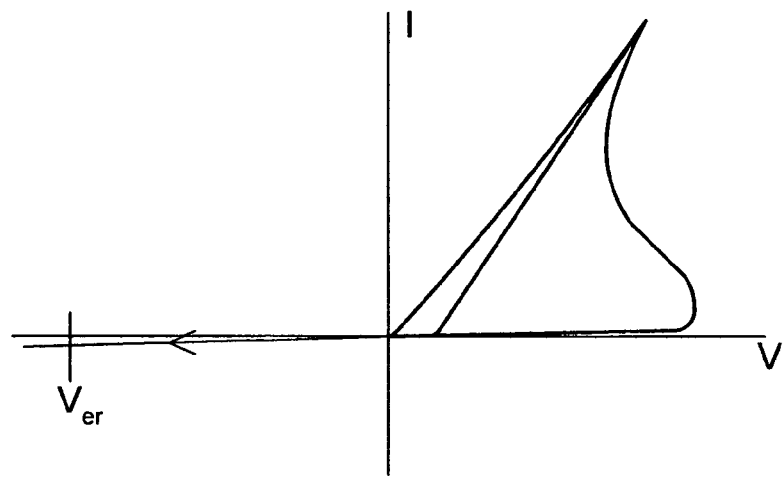
FIG. 5 is a plot of current vs. voltage in the erasing of a programmed memory element in accordance with FIG. 4.
Figure 6:
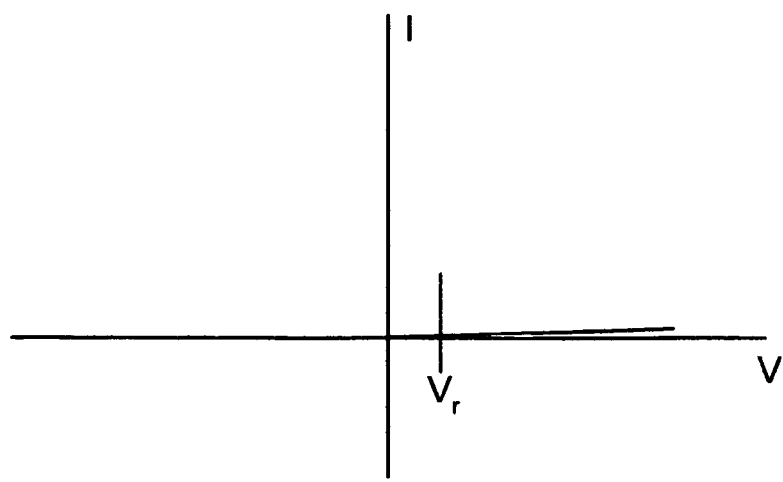
FIG. 6 is a plot of current vs. voltage in the reading of the erased memory element in accordance with FIG. 5.
Figure 7:
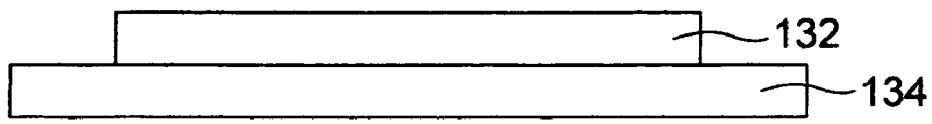
FIGS. 7–10 are sectional views illustrating steps in the fabrication of a first embodiment of memory element.
Figure 8:
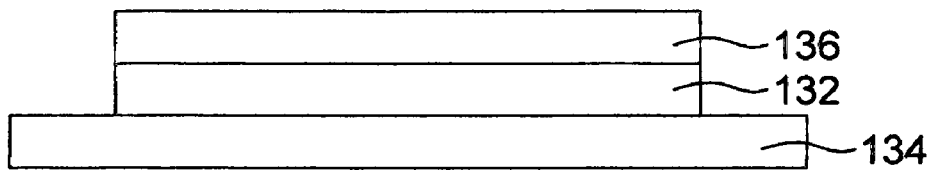

FIGS. 7–10 illustrate a process for fabricating a first embodiment of memory element 130 in accordance with the present invention. Initially, an electrode 132 is formed on a substrate 134 (FIG. 7). The electrode 132 may be formed by any suitable technique, such as physical vapor deposition, i.e. PVD (such as thermal vacuum evaporation, e-beam deposition or sputtering), ion plating, chemical vapor deposition, i.e. CVD (such as metal-organic CVD, i.e. MOCVD), plasma-enhanced CVD, i.e. PECVD, and the like. The electrode 132 in this embodiment is copper, but it will be understood that the electrode 132 can be formed of any of a number of materials including aluminum, barium, calcium, chromium, cobalt, copper, germanium, gold, magnesium, manganese, molybdenum, indium, iron, nickel, palladium, platinum, ruthenium, samarium, silver, tantalum, titanium, tungsten, zinc, metal oxides, polysilicon, doped amorphous silicon, metal silicide, metal carbide, metal nitrides, magnesium-silver alloy, nickel-cobalt alloy, iron-nickel-cobalt alloy, iron-nickel alloy, nickel-copper alloy, and nickel-chromium alloy. Next, a passive layer 136, in this embodiment copper sulfide, is formed over, on and in contact with the electrode 132 (FIG. 8). Examples of other conductivity facilitating compounds that may constitute the passive layer 136 include one or more of copper sulfide ($Cu_xS$, $1 \leq x \leq 2$), copper rich copper sulfide, copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), mixtures thereof, and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

Figure 9:
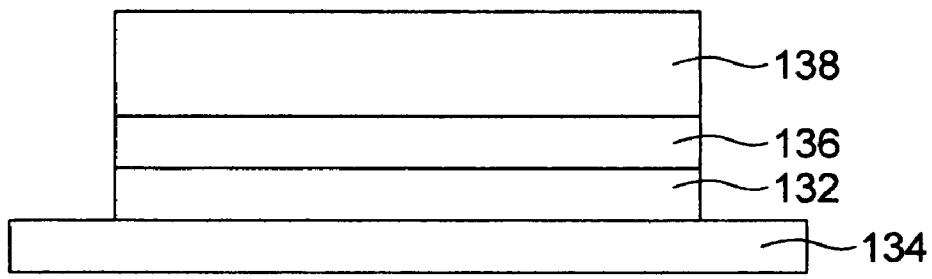

Then, an active layer 138 in the form of an organic polymer coating layer or film is provided on, over and in contact with the passive layer 136 (FIG. 9). The layer 138 in this embodiment is F8T2. F8T2 is a polyfluorene, in particular a poly[(9,9-dioctylfluorenyl-2,7-diyl)co-alt-5,5'-(2,2'bithiophene)]. Other materials of this class are based on the dialkylfluorene group. The chemical structure of a poly (dialkylfluorene) is:

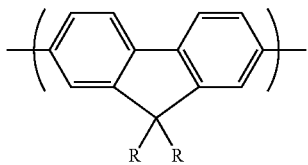

The fluorene can also have substituents on the aryl rings as illustrated:

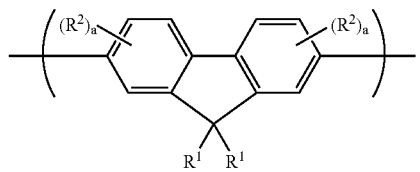

wherein $R^1$ is independently in each occurrence H, $C_1$–$C_{20}$ hydrocarbyl or $C_1$–$C_{20}$ hydrocarbyl containing one or more S, N, O, P or Si atoms, $C_4$–$C_{16}$ hydrocarbyl carbonyloxy, $C_4$–$C_{16}$ aryl(trialkylsiloxy) or both $R^1$ may form with the 9-carbon on the fluorene ring a $C_5$–$C_{20}$ cycloaliphatic structure or a $C_4$–$C_{20}$ cycloaliphatic structure containing one or more heteroatoms of S, N, or O; $R^2$ is independently in each occurrence $C_1$–$C_{20}$ hydrocarbyl, $C_1$–$C_{20}$ hydrocarbyloxy, $C_1$–$C_{20}$ thioether, $C_1$–$C_{20}$ hydrocarbylcarbonyloxy or cyano; and a is independently in each occurrence an integer from 0 to 3.

More particularly, F8T2 is an example of a poly(fluorene-arylene) copolymer, the chemical structure of which is:

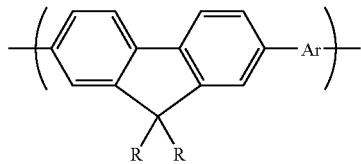

Arylenes can include heterocycles such as pyridine, bipyridine, quinoline, biquinoline, terpyridine, thiophene, bithiophene, and alkyl- or alkoxy-substituted derivatives thereof, which provide with the polyfluorene copolymer a polyfluorene heteroaromatic copolymer. The poly(fluorene-arylene) copolymer is specified as comprising 10–90% by weight of fluorene units and 90–10% by weight aryl units, and comprising at least three repeat units.

The chemical structure of F8T2 is:

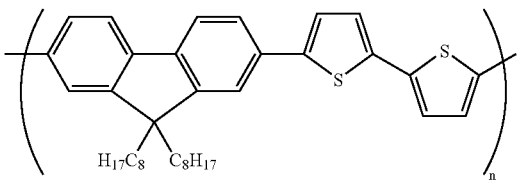

The F8T2 may range from for example 50 angstroms to 1 mm thick, preferably ranging from 50 angstroms to 1000 angstroms thick, and may be deposited by spin-on techniques. In this particular embodiment, the F8T2 is spun onto the layer 136 in the form of, for example, 1.5 wt % polymer in o-xylene solvent, at 1500 rpm for 30 seconds with a 750 rpm/s ramp, to provide a layer 138 approximately 700 angstroms thick. The film is then dried at 90° C. under vacuum for 30 minutes. An optional curing step can be undertaken at this point, at a temperature of 250–350° C. This spin-on step provides uniform coverage of elements thereunder.

Figure 10:
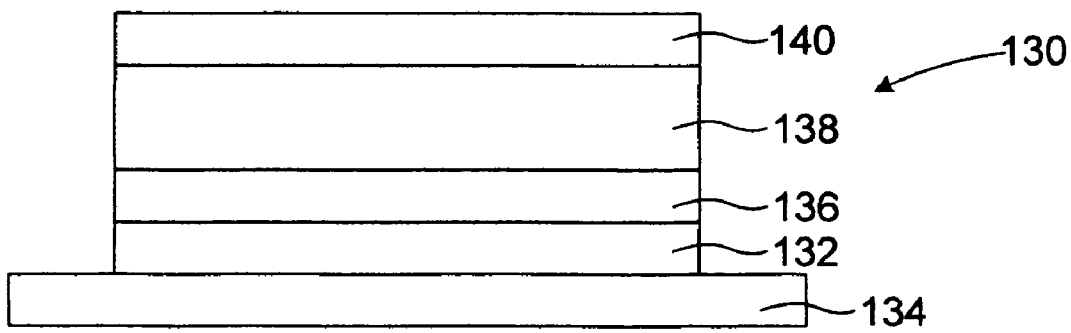

Then, an electrode 140 is formed to a desired thickness on, over and in contact with the active layer 138 (FIG. 10). The electrode 140 in this embodiment is titanium, but it will be understood that the electrode 140 may be formed of any the materials listed with regard to electrode 132, and may be formed by the techniques listed with regard to electrode 132.

Figure 11:
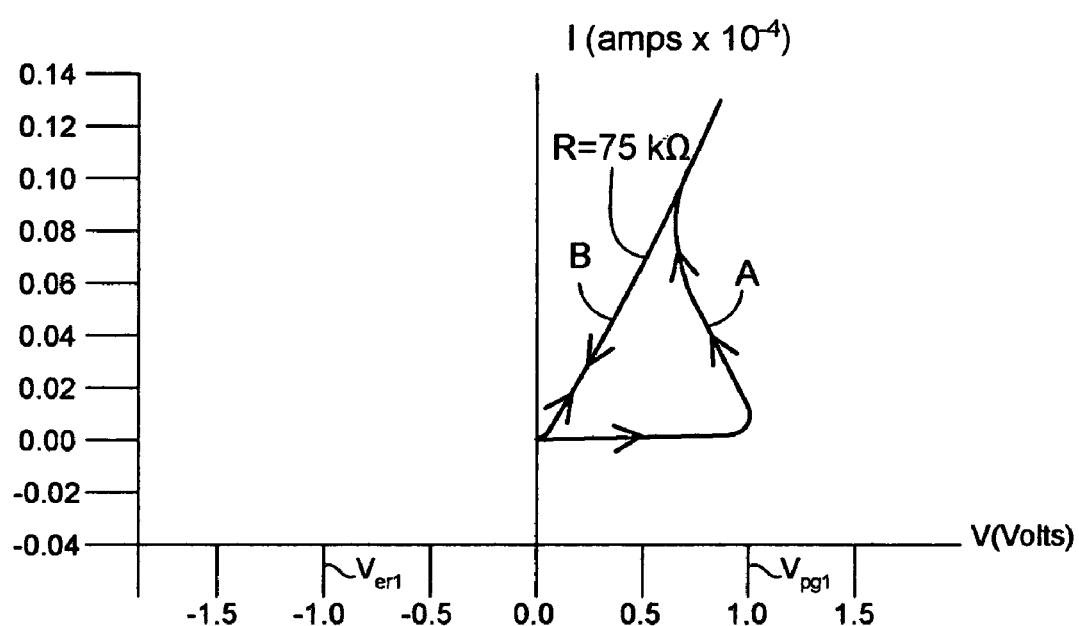
FIG. 11 is a plot of current vs. voltage in the programming of the memory element of FIG. 10.

FIG. 10 illustrates the fabricated memory element 130, wherein the layers 136, 138 are formed between the electrodes 132, 140. This memory element 130 shows the electrical characteristics illustrated in FIG. 11, which will now be described. This memory element 130 as thus constructed has a programming voltage $V_{pg1}$ of approximately 1.0 volts and an erase voltage $V_{er1}$ of approximately −1.0 volts. In order to program the memory element 130, an electrical potential $V_{pg1}$ of 1.0 volts is applied across the memory element 130 from a higher to a lower electrical potential in the forward direction of the memory element 130. This potential is sufficient to cause copper ions to be attracted from the superionic layer 136 toward the electrode 140 and into the active layer 138 (A), causing the active layer 138 (and the overall memory element 130) to be in a (forward) low-resistance or conductive state with a forward current on-resistance of approximately 75 kΩ. Upon removal of such potential (B), the copper ions drawn into the active layer 138 during the programming step remain therein, so that the active layer 138 (and memory element 130) remain in a conductive or low-resistance state.

Figure 12:
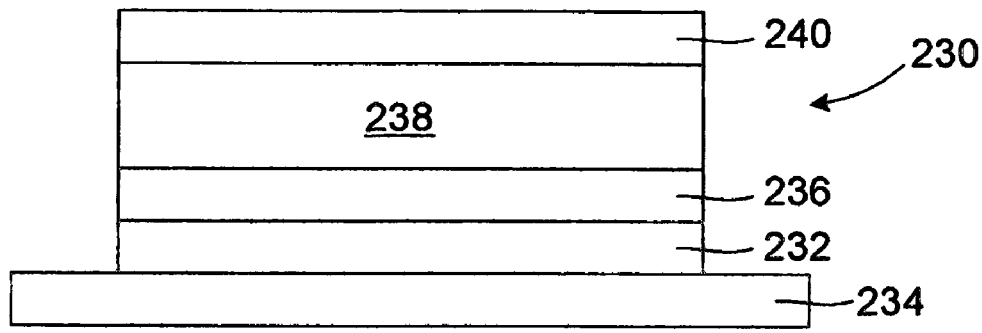
FIG. 12 is a cross-sectional view illustrating a second embodiment of memory element.

FIG. 12 illustrates a second embodiment of memory element 230. In this embodiment, again, an electrode 232 of, for example, copper is provided on, over and in contact with a substrate 234, a passive layer 236, for example, copper sulfide is provided on, over in contact with the electrode 232, an active layer 238 (approximately 700 angstroms thick) in the form of a polyfluorene layer is provided on, over and in contact with the passive layer 236, and an electrode 240 of, for example, titanium, is provided on, over and in contact with the polyfluorene layer 238, with the active and passive layers 238, 236 between the electrodes 232, 240. The memory element 230 takes the form of and is fabricated in the same manner as the memory element 130, described above. Again, arylenes can include heterocycles such as pyridine, bipyridine, quinoline, biquinoline, tepyridine, thiophene, bithiophene, and alkyl- or alkoxy-substituted derivatives thereof, which provide with the polyfluorene copolymer a polyfluorene heteroaromatic copolymer. The poly(fluorene-arylene) copolymer is specified as comprising 10–90% by weight of fluorene units and 90–10% by weight aryl units, and comprising at least three repeat units.

In this embodiment, the polyfluorene layer is F8Py, in particular poly[(9,9-dioctylfluorenyl-2,7-diyl)-co-alt-2,5-pyridine], a poly(fluorene-arylene) copolymer, having the chemical structure:

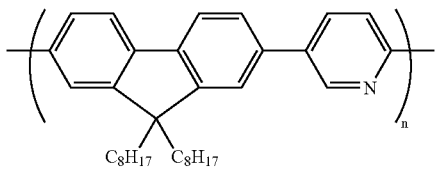

Figure 13:
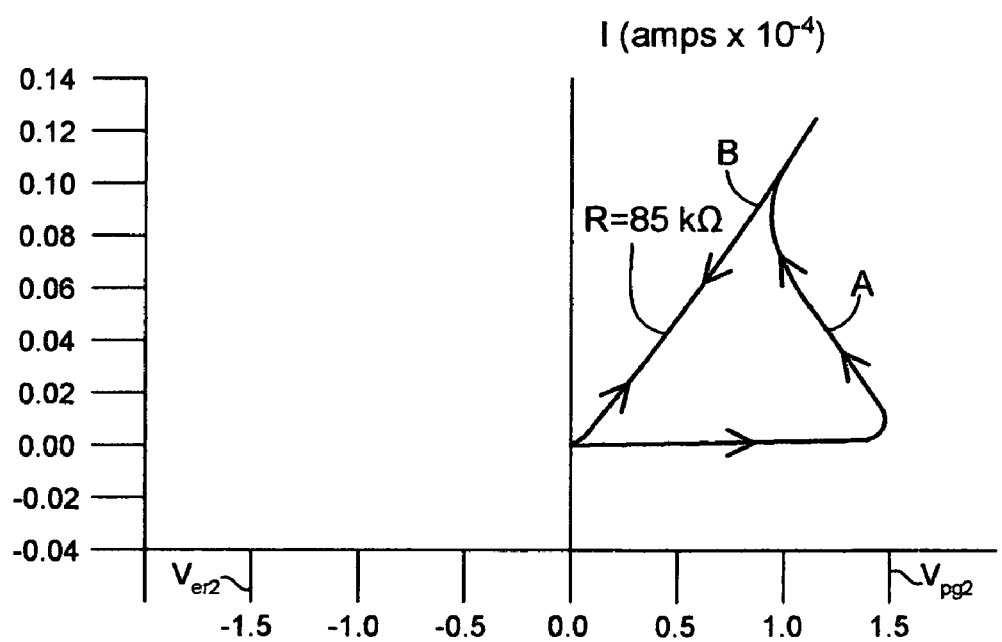
FIG. 13 is a plot of current vs. voltage in the programming of the memory element of FIG. 12.

This memory element 230 as thus constructed has a programming voltage $V_{pg2}$ of approximately 1.5 volts and an erase voltage $V_{er2}$ of approximately −1.5 volts. In order to program the memory element 230 (FIG. 13), an electrical potential $V_{pg2}$ of 1.5 volts is applied across the memory element 230 from a higher to a lower electrical potential in the forward direction of the memory element hundred 30. This potential is sufficient to cause copper ions to be attracted from the superionic layer 236 toward the electrode 240 and into the active layer 238 (A), causing the active layer 238 (and the overall memory element 230) to be in a (forward) low-resistance or conductive state with a forward current on-resistance of approximately 85 kΩ. Upon removal of such potential (B), the copper ions drawn into the active layer 238 during the programming step remain therein, so that the active layer 238 (and memory element 230) remain in a conductive or low-resistance state.

As illustrated and described, changing the chemical composition of the polyfluorene involved allows one to provide selected, different operating characteristics of the memory element. As will be readily seen, the programming and erase voltages and on-resistance of a fabricated memory element can be varied by selecting the particular chemical structure of the polyfluorene. In the particular examples given it will be seen that the second embodiment provides the advantages that the window for read potential is increased, and, with increased programming and erase voltages, there is less chance for accidental disturb. These are examples of advantages that can be obtained by varying the chemical composition.

In addition, the materials of this type are very resistant to high temperatures, and thus can readily withstand the very high temperatures involved in back-end processing, without degradation in performance of the device.

Furthermore, memory elements of the type shown in described are stackable in a memory array, so as to improve density of the memory array.

The foregoing description of embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory structure comprising:
    first and second electrodes;
    a passive layer; and
    a polyfluorene active layer, charged species being transportable from the passive layer to the active layer to determine a first memory state, and being transportable from the active layer to the passive layer to determine a second memory state;
    the passive and active layers being between the first and second electrodes;
    wherein the polyfluorene layer is a poly(fluorene-arylene) copolymer layer.

2. The memory structure of claim 1 wherein the poly(fluorene-arylene) copolymer layer comprises poly[(9,9-dioctylfluorenyl-2,7-diyl)-co-alt-5,5'-(2,2'bithiophene)](F8T2).

3. The memory structure of claim 1 wherein the poly(fluorene-arylene) copolymer layer comprises poly[(9,9-dioctylfluorenyl-2,7-diyl)-co-alt-2,5-pyridine](F8Py).

4. The memory structure of claim 2 wherein the passive layer is copper sulfide.

5. The memory structure of claim 3 wherein the passive layer is copper sulfide.

6. The memory structure of claim 1 wherein one of the electrodes is copper.

7. The memory structure of claim 1 wherein one of the electrodes is titanium.

8. The memory structure of claim 4 wherein one of the electrodes is copper and is in contact with the passive layer.

9. The memory structure of claim 5 wherein one of the electrodes is copper and is in contact with the passive layer.

10. A method of providing a memory structure comprising:
    providing a first electrode;
    providing a first layer in contact with the first electrode;
    providing a second layer in contact with the first layer; and
    providing a second electrode in contact with the second layer, wherein one of the first and second layers is a passive layer, and the other of the first and second layer is an active layer charged species being transportable from the passive layer to the active layer to determine a first memory state, and being transportable from the active layer to the passive layer to determine a second memory state, and wherein the active layer is a polyfluorene layer, wherein the polyfluorene layer is a poly(fluorene-arylene) copolymer layer.

11. The method of claim 10 wherein the poly(fluorene-arylene) copolymer layer comprises poly[(9,9-dioctylfluorenyl-2,7-diyl)-co-alt-5,5'-(2,2'bithiophene)] (F8T2).

12. The method of claim 10 wherein the poly(fluorene-arylene) copolymer layer comprises poly[(9,9-dioctylfluorenyl-2,7-diyl)-co-alt-2,5-pyridine] (F8Py).

13. The method of claim 10 wherein the first layer is a passive layer, and the second layer is an active layer.

14. The method of claim 11 wherein the passive layer is copper sulfide.

15. The method of claim 12 wherein the passive layer is copper sulfide.

* * * * *